(12) United States Patent
Inoue

(10) Patent No.: US 10,555,089 B2
(45) Date of Patent: Feb. 4, 2020

(54) TRANSDUCER

(71) Applicant: OMRON Corporation, Kyoto (JP)

(72) Inventor: Tadashi Inoue, Shiga (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 16/125,017

(22) Filed: Sep. 7, 2018

(65) Prior Publication Data

US 2019/0116427 A1    Apr. 18, 2019

(30) Foreign Application Priority Data

Oct. 18, 2017  (JP) .................................. 2017-201800

(51) Int. Cl.
*H04R 19/00*    (2006.01)
*B81B 3/00*    (2006.01)
(Continued)

(52) U.S. Cl.
CPC ......... *H04R 19/005* (2013.01); *B81B 3/0072* (2013.01); *H04R 1/02* (2013.01);
(Continued)

(58) Field of Classification Search
CPC ... B81B 3/0072; B81B 3/0094; B81B 3/0067; B81B 3/0091; G01H 11/06;
(Continued)

(56) References Cited

U.S. PATENT DOCUMENTS

| 8,542,851 B2* | 9/2013 | Kasai | ................... | H04R 19/005 |
| | | | | 381/175 |
| 8,731,220 B2* | 5/2014 | Zhang | ................... | H04R 19/005 |
| | | | | 381/174 |

(Continued)

FOREIGN PATENT DOCUMENTS

| CN | 206923039 U | 1/2018 |
| EP | 2182738 A1 | 5/2010 |

(Continued)

OTHER PUBLICATIONS

Extended European Search Report issued in European Application No. 18192622.1, dated Feb. 22, 2019 (10 pages).

(Continued)

*Primary Examiner* — Fan S Tsang
*Assistant Examiner* — Angelica M McKinney
(74) *Attorney, Agent, or Firm* — Osha Liang LLP

(57) ABSTRACT

A transducer includes: a substrate having a hole; a backplate facing an opening of the hole; and a diaphragm facing the backplate with an air gap therebetween. The backplate includes a backplate body, a backplate support secured to the substrate, and through-holes perforating the backplate body; the backplate body includes a center region and three or more peripheral regions partially or completely surrounding the center region; the through-holes defines a percentage open area in each of the center region and the three or more peripheral regions, and the percentage open areas are mutually different; the percentage open area in the center region is larger than the percentage open area in each of the three or more peripheral regions; and the percentage open area in the outermost peripheral region of the backplate body is smaller than the percentage open area in the peripheral region near the center region.

20 Claims, 15 Drawing Sheets

(51) Int. Cl.
  *H04R 7/04* (2006.01)
  *H04R 31/00* (2006.01)
  *H04R 1/02* (2006.01)
(52) U.S. Cl.
  CPC ............. *H04R 7/04* (2013.01); *H04R 31/003* (2013.01); *B81B 2201/0264* (2013.01); *B81B 2203/0127* (2013.01); *H04R 2201/003* (2013.01)
(58) Field of Classification Search
  CPC ...... H04R 1/2876; H04R 19/005; H04R 7/06; H04R 19/04; H04R 31/003; H04R 1/02; H04R 1/341; B06B 1/0622
  See application file for complete search history.

(56) References Cited

U.S. PATENT DOCUMENTS

| | | | | |
|---|---|---|---|---|
| 9,344,807 | B2* | 5/2016 | Uchida | ................. H04R 19/005 |
| 9,656,300 | B2* | 5/2017 | Yamamoto | ............ B06B 1/0622 |
| 10,149,066 | B2* | 12/2018 | Yoo | ........................ B81B 3/0094 |
| 2002/0067663 | A1 | 6/2002 | Loeppert et al. | |
| 2003/0016839 | A1 | 1/2003 | Loeppert et al. | |
| 2010/0212432 | A1* | 8/2010 | Kasai | ................... H04R 19/005 73/654 |
| 2011/0278684 | A1* | 11/2011 | Kasai | ..................... G01H 11/06 257/416 |
| 2015/0104048 | A1* | 4/2015 | Uchida | ................... H04R 7/06 381/174 |
| 2016/0112806 | A1 | 4/2016 | Yoo | |
| 2017/0006381 | A1 | 1/2017 | Rusconi Clerici et al. | |
| 2017/0339485 | A1* | 11/2017 | Naderyan | ............ H04R 1/2876 |

FOREIGN PATENT DOCUMENTS

| | | |
|---|---|---|
| EP | 2386840 A2 | 11/2011 |
| JP | 4338395 B2 | 10/2009 |
| KR | 10-2010-0032927 A | 3/2010 |
| KR | 10-1601219 B1 | 3/2016 |
| KR | 10-2016-0114068 A | 10/2016 |

OTHER PUBLICATIONS

Office Action issued in Korean Application No. 10-2018-0101889, dated May 28, 2019 (9 pages).

* cited by examiner

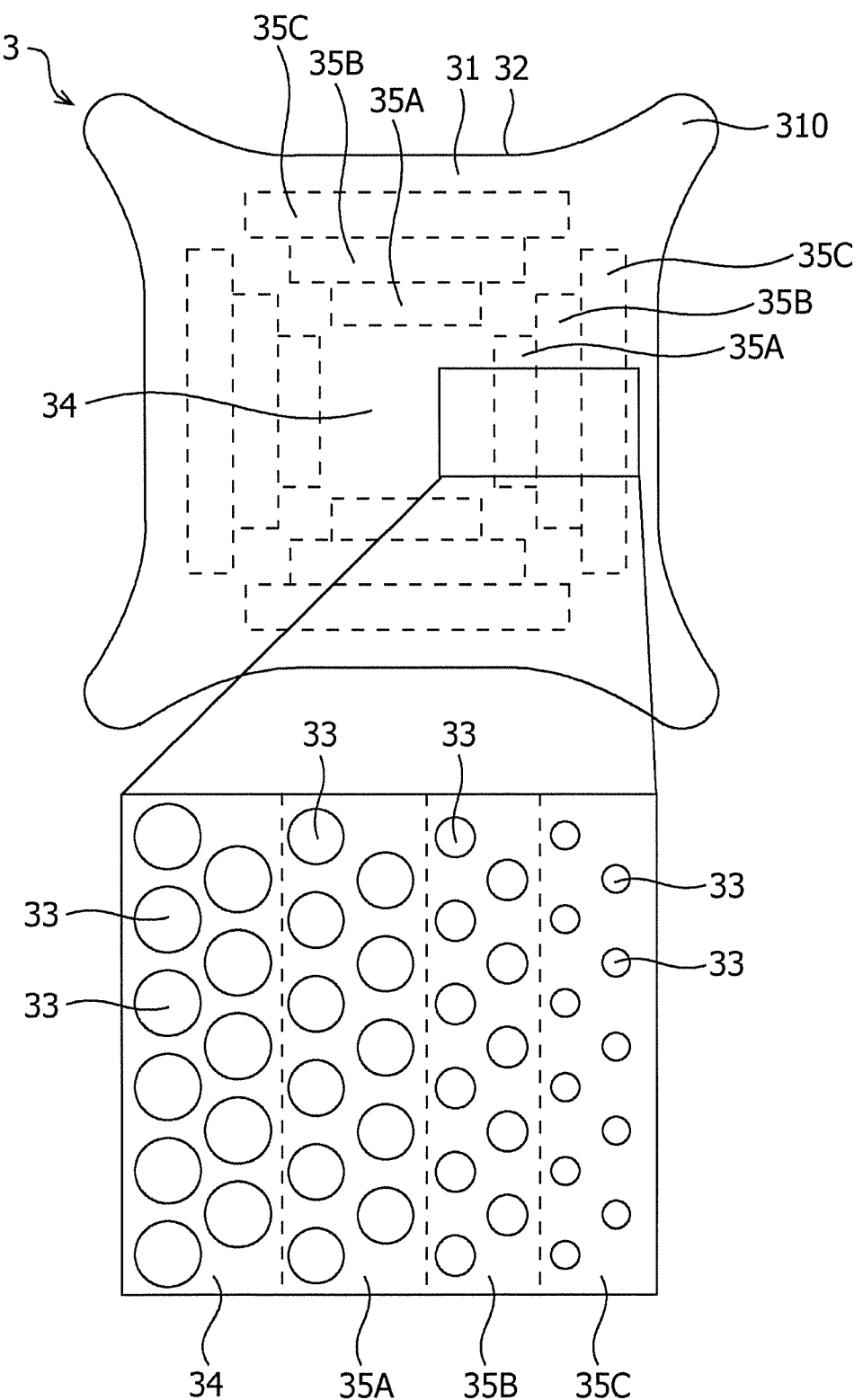

TRANSDUCER

CROSS-REFERENCE TO RELATED APPLICATION

This application is based on Japanese Patent Application No. 2017-201800 filed with the Japan Patent Office on Oct. 18, 2017, the entire contents of which are incorporated herein by reference.

FIELD

The present invention relates to a transducer.

BACKGROUND

The microphones adopted in recent years use capacitive transducers manufactured via micro electro-mechanical systems (MEMS) technology (hereinafter also called MEMS microphones). A capacitive transducer has a vibrating electrode membrane that vibrates under pressure; the vibrating electrode membrane faces a backplate to which the electrode membrane is secured with an air gap. The backplate has a plurality of through-holes. Japanese Patent Document No. 4338395 proposes an acoustic transducer with a cover part, a substrate attached to the cover part, and a diaphragm placed between the cover part and the substrate. The flat surface of the cover part includes a plurality of perforations.

Technical Problem

The signal-to-noise ratio (SNR) increases as the percentage open area defined by through-holes in a backplate increases. However, larger through-holes in the backplate decrease the mechanical strength of the backplate. In view of this situation, the purpose of the present invention is to improve the signal-to-noise ratio while maintaining the mechanical strength of the backplate.

SUMMARY

The present invention adopts the below-described techniques to address the above problem. That is, the present invention provides a transducer including a substrate having a hole, a backplate facing the opening of the hole in the substrate; and a diaphragm facing the backplate with an air gap therebetween; the backplate includes a backplate body, a backplate support secured to the substrate and supporting the backplate body, and a plurality of through-holes; the backplate body includes a center region having a portion of the plurality of through-holes, and three or more peripheral regions partially or completely surrounding the center region and each having another portion of the plurality of through-holes; three or more peripheral regions each partially or completely surround the center region; the plurality of through-holes define a percentage open area in each of the center region and the three or more peripheral regions, and the percentage open areas are mutually different; the percentage open areas in the center region and in the three or more peripheral regions are constant throughout each region; the percentage open area in the center region is larger than the percentage open area in the three or more peripheral regions; and the percentage open area in the outermost peripheral region of the backplate body is less than the percentage open area in the peripheral region near the center region.

The percentage open area defined by the through-holes in the center region is a ratio of the total area occupied by the plurality of through-holes in the center region to the area of the center region. The percentage open area defined by the through-holes in a peripheral region is a ratio of the total area occupied by the plurality of through-holes in the peripheral region to the area of the peripheral region. In the above-described transducer, the center region of the backplate has a larger percentage open area defined by the through-holes therein; the outermost peripheral region of the backplate body of the backplate has a smaller percentage open area defined by the through-holes therein than the percentage open area defined by the through-holes in the peripheral region near the center region of the backplate body. That is, the percentage open area defined by the through-holes in the center region and by each peripheral region gradually decreases from the center region toward the edge of the backplate body of the backplate. Thereby, it is possible to maintain the mechanical strength of a backplate while increasing the percentage open area in the center region and in each peripheral region and thus improve the signal-to-noise ratio.

In the above transducer, the backplate body may appear polygonal with two opposing sides when viewed along a direction normal to the surface of the backplate that faces the diaphragm, and the distance from the edge of the backplate body to the edge of the center region may be 25% or less of the distance between the two opposing sides. In the above transducer, the backplate body may appear circular when viewed along a direction normal to the surface of the backplate facing a diaphragm, and the distance from the edge of the backplate body to the edge of the center region may be 25% or less of the diameter of the circular shape. It is thus possible to maintain the mechanical strength of a backplate while maintaining a larger open area. The percentage open area in the backplate is the ratio of the total area occupied by the through-holes to the total area of the surface of a backplate facing the diaphragm or the rear surface thereof.

In the above transducer, the percentage open area defined by the through-holes in the center region may be 50% or greater. It is possible to improve the signal-to-noise ratio of a transducer by establishing an percentage open area defined by the through-holes in the center region at 50% or greater since the center region tends to significantly affect the noise in the transducer.

In the above transducer, the inner surface of the through-holes may taper with the diameter of the through-hole widening from the surface of the backplate facing the diaphragm toward the surface opposite thereto, and the angle between the inner surface of the through-hole and the surface of the backplate facing the diaphragm may be between 70° and 90°, inclusive. Thus, the section modulus of the bars in the backplate increases, thereby increasing the mechanical strength against bending moment of the bars in the backplate. A bar is a section between two adjacent through-holes in the backplate. Further, the backplate may be more densely perforated with through-holes, and this facilitates increasing the percentage open area in the backplate.

In the above transducer, a part of the backplate support may come in contact with the surface of a diaphragm facing the backplate. Thereby, both the substrate and the diaphragm support the backplate thus increasing the mechanical strength of the backplate. In the above transducer, the backplate body and the backplate support may be formed integrally. The mechanical strength of the backplate increases by integrally forming the backplate body and the backplate support. In the above transducer, the backplate body and the backplate support may be separate materials. This structure facilitates manufacturing the backplate. In the above transducer, the opening of the through-hole may be any one shape selected from a group consisting of a circle, an ellipse, a polygon, and a rounded polygon.

In the above transducer, the opening of the through-holes in at least one of the three or more peripheral regions may be any one shape selected from a group consisting of a circle and an ellipse. This increases the mechanical strength of the backplate around the through-holes included in at least one peripheral region increases.

In the above transducer, except for the peripheral region closest to the edge of the body, the openings of the through-holes in the center region and peripheral regions may be substantially hexagonal. The openings of the through-holes included in the center region may be substantially hexagonal to increase the percentage open area in the center region defined by the through-holes therein. In the above transducer, a plurality of through-holes in the center region may be regularly arranged.

In the above transducer, the openings of the through-holes in at least one of three or more peripheral regions may be an ellipse, and the major axis of the ellipse may be oriented toward the center region. Thereby, the pitch of the through-holes increases along the minor axis of the elliptical through-holes. As a result, the section modulus increases for the bars in the backplate around the through-holes in at least one peripheral region, thereby increasing the mechanical strength of the backplate in relation to the bending stress of the bars of the backplate. In the above transducer, the hole in the substrate may be a cavity.

Effects

The present invention is capable of improving the signal-to-noise ratio while maintaining the mechanical strength of a backplate.

BRIEF DESCRIPTION OF THE DRAWINGS

FIG. 10A is a plan view of a backplate.

DETAILED DESCRIPTION

An embodiment is described below with reference to the drawings. The embodiment described below is an aspect of the present application and should not be regarded as limiting the technical scope of the present application.

The present invention is applicable to a capacitive MEMS device. A capacitive MEMS device may include a pressure sensor, an acoustic sensor, a speaker, an acceleration sensor, a micro-mirror, or the like. An acoustic sensor is described below as an example of a capacitive transducer.

Figure 1:
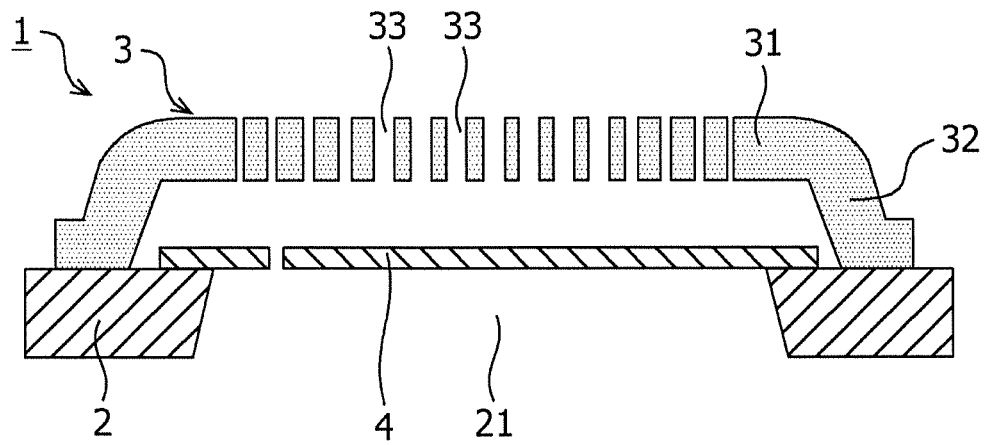
FIG. 1 is a schematic view of a capacitive transducer.
Figure 2:
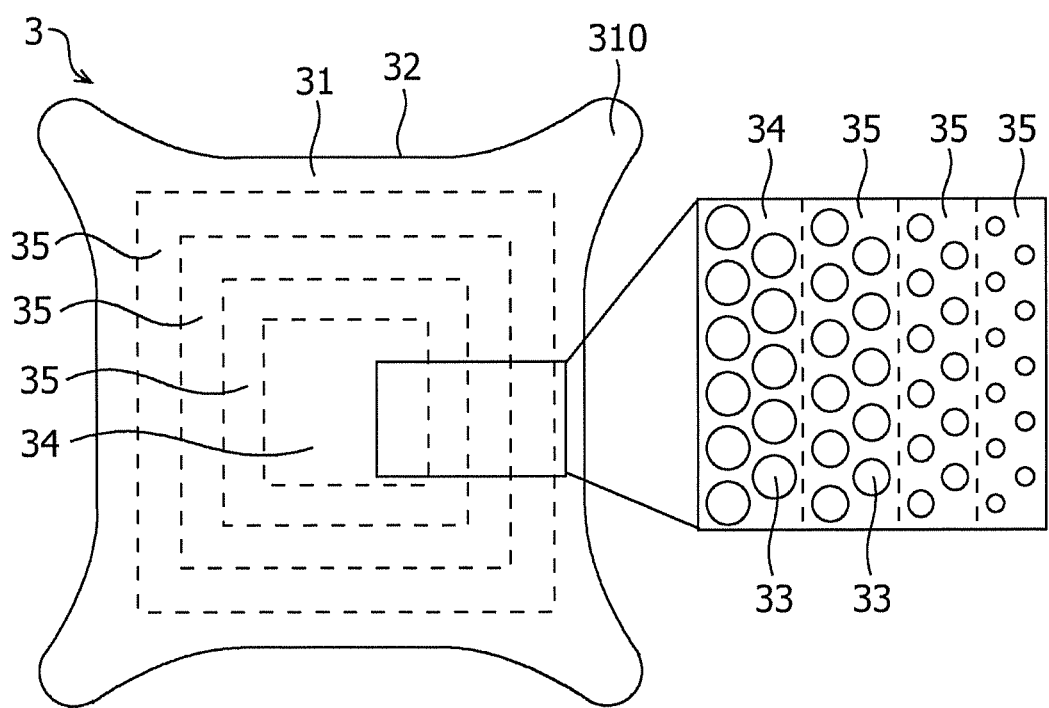
FIG. 2 is a plan view of a backplate.

FIG. 1 is a schematic view of a capacitive transducer. A capacitive transducer 1 includes a substrate 2 having a hole 21, a backplate 3 facing the opening of the hole 21 in the substrate 2, and a diaphragm 4 facing the backplate 3 with an air gap therebetween. FIG. 2 is a plan view of the backplate 3. The backplate 3 includes a backplate body 31, a backplate support 32, and a plurality of through-holes in the backplate body 31. The backplate support 32 is supported on the substrate 2 and supports the backplate body 31. The diaphragm 4 may have a hole or a slit for ventilation; this allows the diaphragm 4 to be resistant to changes in atmospheric pressure.

The backplate body 31 has protrusions 310 at the four corners thereof in plan view. The backplate support 32 supports the backplate body 30 and the protrusions 310. In the example of the backplate 3 shown in FIG. 2, the four corners of the backplate body 31 appear to protrude in plan view, but the four corners of the backplate body 31 do not need to protrude in plan view. The backplate body 31 includes a center region 34 having a portion of the plurality of through-holes 33, and three or more peripheral regions 35 surrounding the center region 34 and each having another portion of the plurality of through-holes 33. The three or more peripheral regions 35 surround the center region 34. The percentage open area (open area ratio) defined by the through-holes 33 in the center region 34 and the percentage open area defined by each of the three or more peripheral regions 35 are mutually different. The percentage open area defined by the through-holes 33 in the center region 34 is a ratio of the total area occupied by the plurality of through-holes 33 in the center region 34 to the area of the center region 34. The percentage open area defined by the through-holes 33 in each peripheral region 35 is a ratio of the total area occupied by the plurality of through-holes 33 included in the peripheral region 35 to the area of the peripheral region 35.

The size of the through holes 33 in the center region 34 is constant throughout the center region 34. The size of the through-holes 33 in a peripheral region 35 is also constant throughout the peripheral region. The percentage open area defined by the through-holes 33 in the center region 34 is larger than the percentage open area defined by the through-holes 33 in each of the three or more peripheral regions. The percentage open area defined by the through-holes 33 in the outermost peripheral region 35 of the backplate body 31 is smaller than the percentage open area defined by the through-holes 33 in the peripheral region 35 near the center region 34. That is, the percentage open area defined by the through-holes in each of the three or more peripheral regions gradually decreases from the peripheral region 35 near the center region 34 toward the outer edge of the backplate body 31.

Figure 3:
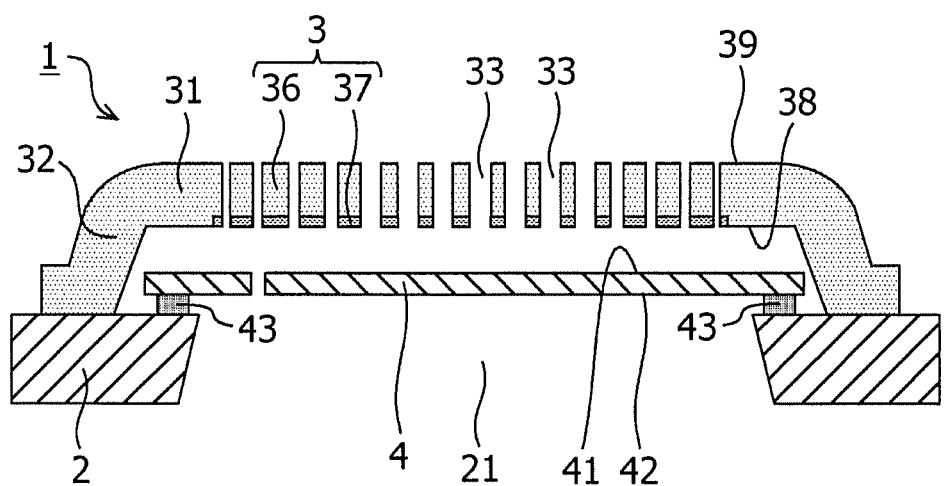
FIG. 3 is a schematic view of a capacitive transducer.
Figure 4:
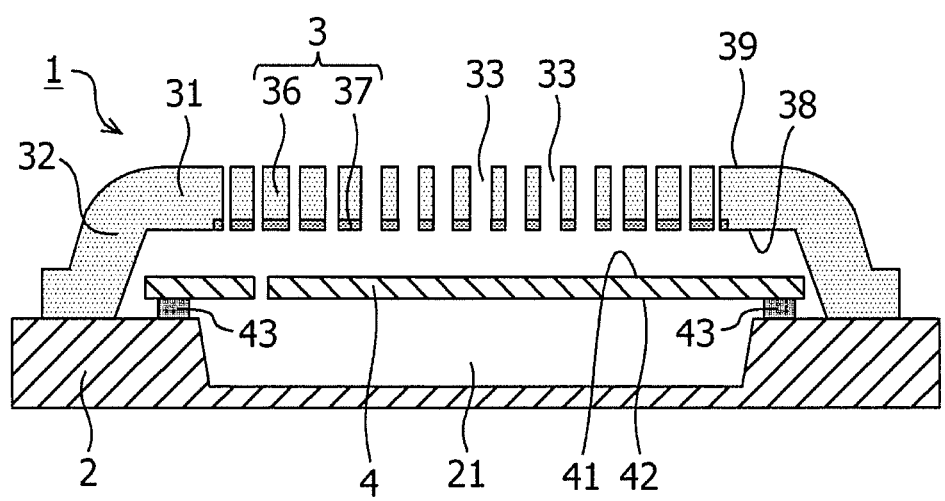
FIG. 4 is a schematic view of a capacitive transducer.

FIG. 3 is a schematic view of a capacitive transducer 1. The capacitive transducer 1 is manufactured using MEMS technology. The capacitive transducer 1 includes a silicon (Si) substrate 2, a backplate 3, and a diaphragm 4. The silicon substrate 2 is an example of a substrate. The silicon substrate 2 has a hole 21. In FIG. 3, the hole 21 perforates the silicon substrate 2. However, the hole 21 may be a cavity in the silicon substrate 2. That is, the hole 21 may be a recess in the surface of the silicon substrate 2. The hole 21 in the silicon substrate 2 ensures there is no less than a certain distance between the silicon substrate 2 and the diaphragm 4, thereby reducing the resistance between the silicon substrate 2 and the diaphragm 4.

The backplate 3 includes a fixed plate 36 and a fixed electrode film 37 in contact with the fixed plate 36. The backplate 3 is on the silicon substrate 2 and covers the hole 21 in the silicon substrate 2. That is, the backplate 3 faces the opening of the hole 21 in the silicon substrate 2. The edge of the backplate 3 is connected to the silicon substrate 2; the backplate 3 rises from the silicon substrate 2 forming a dome-like shape, and the center part of the backplate 3 is elevated above the silicon substrate 2.

The backplate 3 is perforated by a plurality of through-holes 33. The diaphragm 4 faces the backplate 3 via an air gap. The bottom surface 38 of the backplate 3 faces the upper surface 41 of the diaphragm 4, and the upper surface 39 of the backplate and the upper surface 41 of the diaphragm 4 face the same direction. The diaphragm 4 is on the silicon substrate 2 covering the opening of the hole 21 in the silicon substrate 2. The diaphragm 4 is secured to the silicon substrate 2 via a fixing part 43 provided on the bottom surface 42 of the diaphragm 4. The diaphragm 4 vibrates vertically in response to sound pressure. The diaphragm 4 may have a hole or a slit for ventilation; this allows the diaphragm to be resistant to changes in atmospheric pressure.

The diaphragm 4 of the capacitive transducer 1 vibrates in response to sound, thereby changing the distance between the diaphragm 4 and the fixed electrode film 37. When the distance between the diaphragm 4 and the fixed electrode film 37 changes, the capacitance between the diaphragm 4 and the fixed electrode film 37 changes. Electrode pads electrically connected to the diaphragm 4 and the fixed electrode film 37 respectively are energized by applying a DC voltage thereto; the energized electrode pads convert changes in capacitance to electrical signals which represent the sound pressure detected.

Figure 5A:
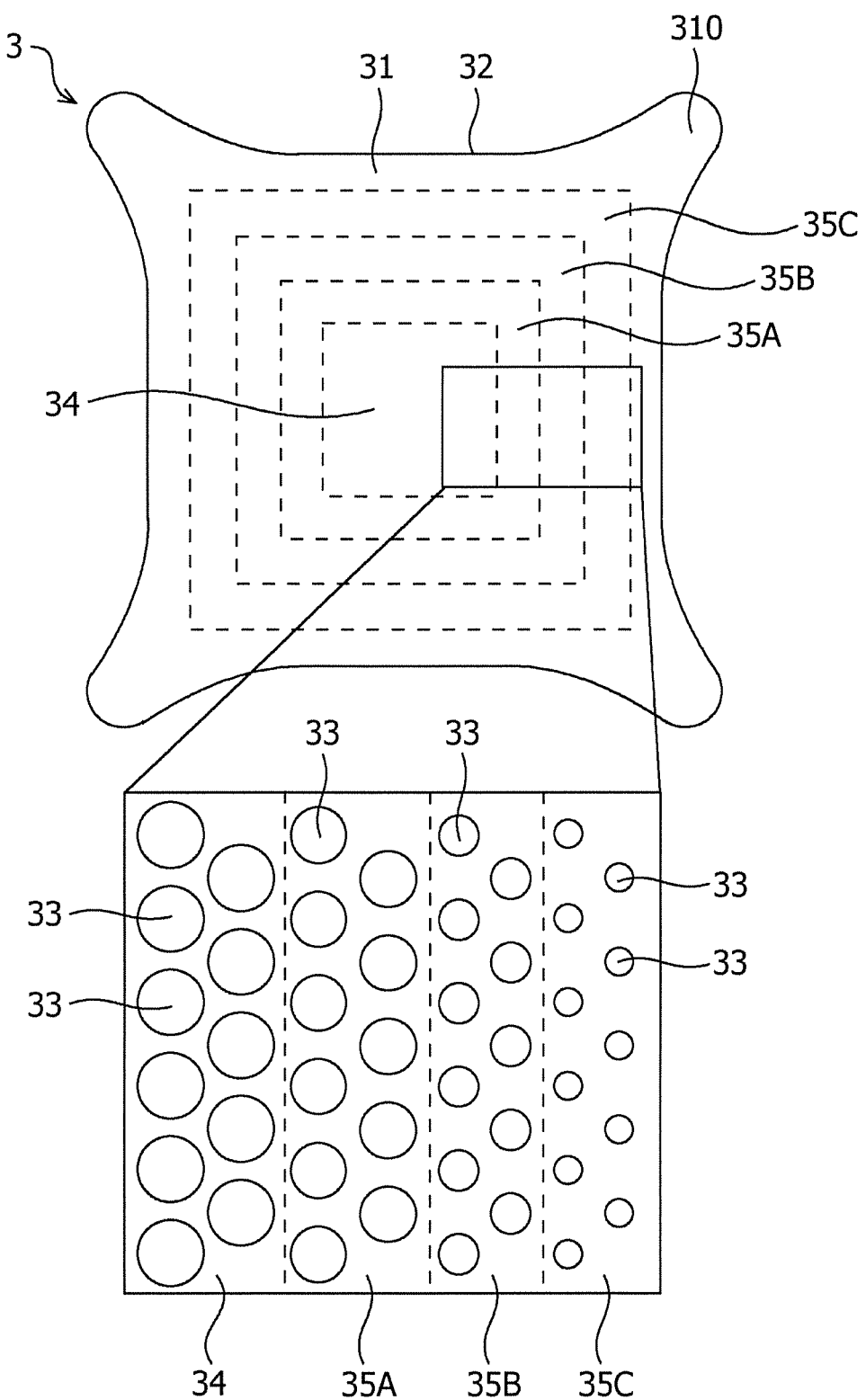
FIG. 5A is a plan view of a backplate.
Figure 5B:
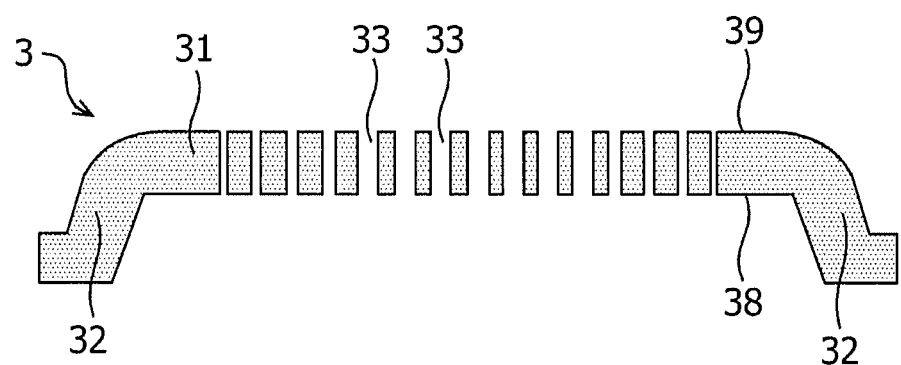
FIG. 5B is a schematic view of a backplate.
Figure 5C:
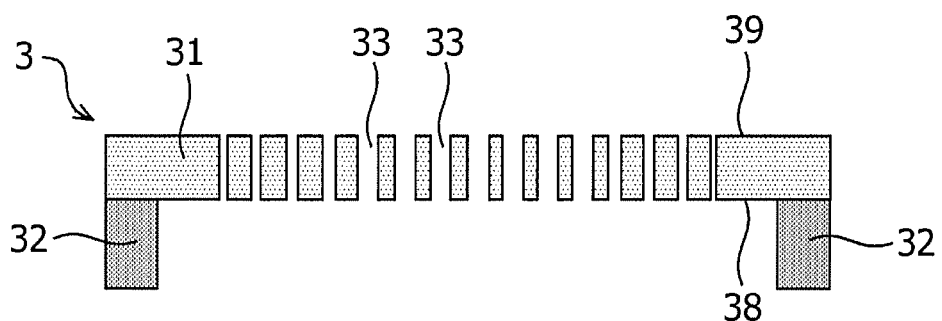
FIG. 5C is a schematic view of a backplate.

FIG. 5A is a plan view of the backplate 3. FIG. 5B and FIG. 5C are schematic views of the backplate 3. The backplate 3 includes the backplate body 31 and the backplate support 32 on the backplate body 31 that surrounds the edges of the backplate body 31. As shown in FIG. 5B, the backplate body 31 and the backplate support 32 may be formed integrally. That is, the backplate body 31 and the backplate support 32 may be formed from the same material. As shown in FIG. 5C, the backplate body 31 and the backplate support 32 may be formed separately. That is, the backplate body 31 and the backplate support 32 may be separate materials. The backplate body 31 and the backplate support 32 are connected to each other when the backplate body 31 and the backplate support 32 are separate. The backplate body 31 and the backplate support 32 may be connected via an adhesive. The backplate body 31 and the backplate support 32 may be connected by inserting a projection on the backplate body 31 into a groove in the backplate support 32. Alternatively, the backplate body 31 and the backplate support 32 may be connected by inserting a projection on the backplate support 32 into a groove in the backplate body 31. The backplate support 32 supports the backplate body 31 while the backplate support 32 is secured to the silicon substrate 2. Using separate materials for the backplate body 31 and the backplate support 32 facilitates manufacturing the backplate 3.

The through-holes 33 perforate the backplate body 31. The backplate body 31 includes the center region 34 and the three or more peripheral regions 35 surrounding the center region 34. In the example of the backplate 3 shown in FIG. 5A, the backplate body 31 includes the center region 34 and the three peripheral regions 35 (35A to 35C) surrounding the center region 34. Each of the peripheral regions 35A to 35C may completely (continuously) surround the center region 34. The peripheral regions 35A to 35C may have a frame-like shape (annular shape). The peripheral region 35A is the nearest to the center region 34 and completely surrounds the center region 34. The peripheral region 35B completely surrounds the center region 34 and the peripheral region 35A. The peripheral region 35C is nearest to the edge of the backplate body 31 and completely surrounds the center region 34 and the peripheral regions 35A, 35B. Thus, the peripheral regions 35A to 35C are arranged side by side from the center region 34 toward the edge of the backplate body 31. Without being limited to the example of the backplate 3 shown in FIG. 5A, the backplate body 31 may include a center region 34 and four or more peripheral regions 35 surrounding the center region 34.

The widths of the peripheral regions 35A to 35C may be the same or may be mutually different. For example, the peripheral region 35A and the peripheral region 35B may be the same width while the peripheral region 35C is wider than the peripheral region 35B. Each of the center region 34 and the peripheral regions 35A to 35C has a plurality of through-holes 33. The plurality of through-holes 33 in the center region 34 and in the peripheral regions 35A to 35C may be arranged regularly or irregularly (at random). For example, the plurality of through-holes 33 in the center region 34 may be arranged regularly and the plurality of through-holes 33 in the peripheral regions 35A to 35C may be arranged irregularly. However, the plurality of through-holes 33 in the center region 34 and in the peripheral regions 35A to 35C are preferably arranged regularly to allow fast and uniform production of the backplate 3.

The percentage open areas defined by the through-holes in the center region 34 and in each of the peripheral regions 35A to 35C are mutually different. The percentage open area defined by the through-holes 33 in the center region 34 (hereinafter, referred to as the percentage open area in the center region 34) is a ratio of a total area occupied by the plurality of the through-holes 33 in the center region 34 to the area of the center region 34. The percentage open area defined by the through-holes 33 in the peripheral region 35A (hereinafter, referred to as the percentage open area in the peripheral region 35A) is a ratio of a total area occupied by the plurality of the through-holes 33 in the peripheral region 35A to the area of the peripheral region 35A. The percentage open area defined by the through-holes 33 in the peripheral region 35B (hereinafter, referred to as the percentage open area in the peripheral region 35B) is a ratio of a total area occupied by the plurality of the through-holes 33 in the peripheral region 35B to the area of the peripheral region 35B. The percentage open area defined by the through-holes 33 in the peripheral region 35C (hereinafter, referred to as the percentage open area in the peripheral region 35C) is a ratio of a total area occupied by the plurality of the through-holes 33 in the peripheral region 35C to the area of the peripheral region 35C. The area occupied by the through-holes 33 is acquired with the bottom surface 38 of the backplate 3 as a reference. The bottom surface 38 of the backplate 3 is also preferably used as the reference when calculating the noise of the capacitive transducer 1. However, the upper surface 39 of the backplate 3 may be used as the reference when determining the area occupied by the through-holes 33.

The percentage open area in the center region 34 is uniform throughout the center region 34. The percentage open area in the peripheral region 35A is uniform throughout the peripheral region 35A. The percentage open area in the peripheral region 35B is uniform throughout the peripheral region 35B. The percentage open area in the peripheral region 35C is uniform throughout the peripheral region 35C. The percentage open area in the center region 34 is greater than the percentage open area in each of the peripheral regions 35A to 35C. The percentage open area in the peripheral region 35B is less than the percentage open area in the peripheral region 35A. The percentage open area in the peripheral region 35C is less than the percentage open area in the peripheral region 35B. Thus, the percentage open area defined by the through-holes 33 in the outermost peripheral region 35 of the backplate body 31 is less than the percentage open area defined by the through-holes 33 in the peripheral region 35 near the center region 34. That is, the percentage open areas in the center region 34 and in the peripheral regions 35A to 35C gradually decrease from the center region 34 of the backplate body 31 toward the edge of the backplate body 31.

Figure 5D:
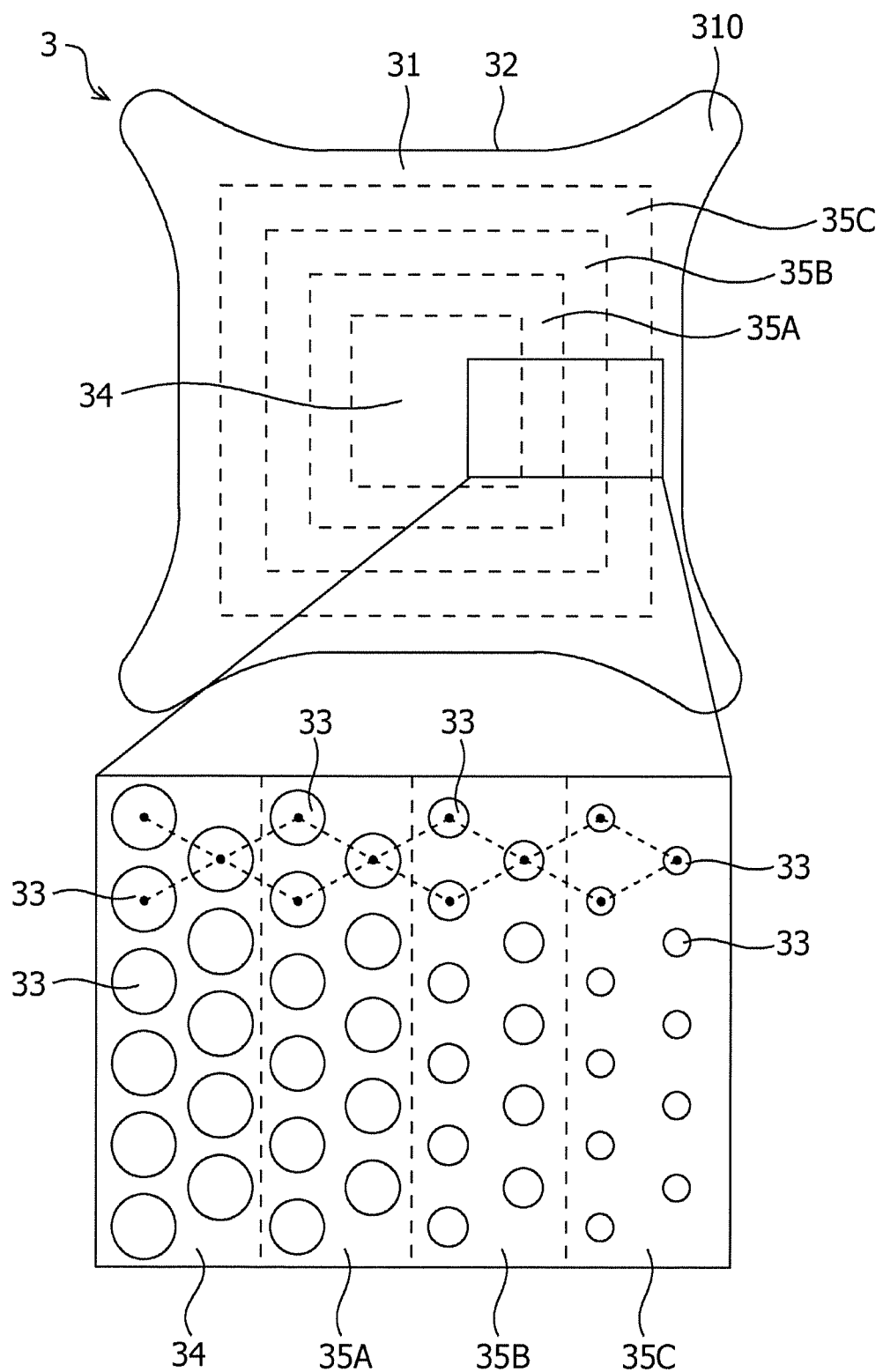
FIG. 5D is a plan view of a backplate.

The size (area) of the opening of each through-hole 33 in the center region 34 and in the peripheral regions 35A to 35C may be mutually different, and the pitch of the through-holes 33 in the center region 34 and in the peripheral regions 35A to 35C may be the same. The pitch of the through-holes 33 is the distance between the centers of two adjacent through-holes 33. The size of the opening of each through-hole 33 in the center region 34 and in the peripheral regions 35A to 35C may be the same and the pitch of through-holes 33 in the center region 34 and in the peripheral regions 35A to 35C may be mutually different. FIG. 5D is a plan view of the backplate 3. In the example of the backplate 3 shown in FIG. 5D, the sizes of the openings of the through-holes 33 in the center region 34 and in the peripheral regions 35A to 35C are different from each other and the pitches of the through-holes 33 in the center region 34 and in the peripheral regions 35A to 35C are the same. In the example of the backplate 3 shown in FIG. 5D, the sizes of the openings of the through-holes 33 in the center region 34 and in the peripheral regions 35A to 35C gradually decrease from the center region 34 toward the edge of the backplate body 31.

The shapes of the openings for the through-holes 33 may be a circle, an ellipse, and a polygon including a quadrangle (and substantially a quadrangle) and a hexagon (and substantially a hexagon). Further, the shape of the opening of a through-hole 33 may be a rounded polygon. The openings of the through-holes 33 in the center region 34 and in the peripheral regions 35A to 35C may have the same shape. The openings of the through-holes 33 in the center region 34 and in the peripheral regions 35A to 35C may have mutually different shapes. The shape of the opening of the through-holes 33 in the center region 34 and the shape of the opening of the through-holes 33 in at least one of the peripheral regions 35A to 35C may be the same.

Figure 5E:
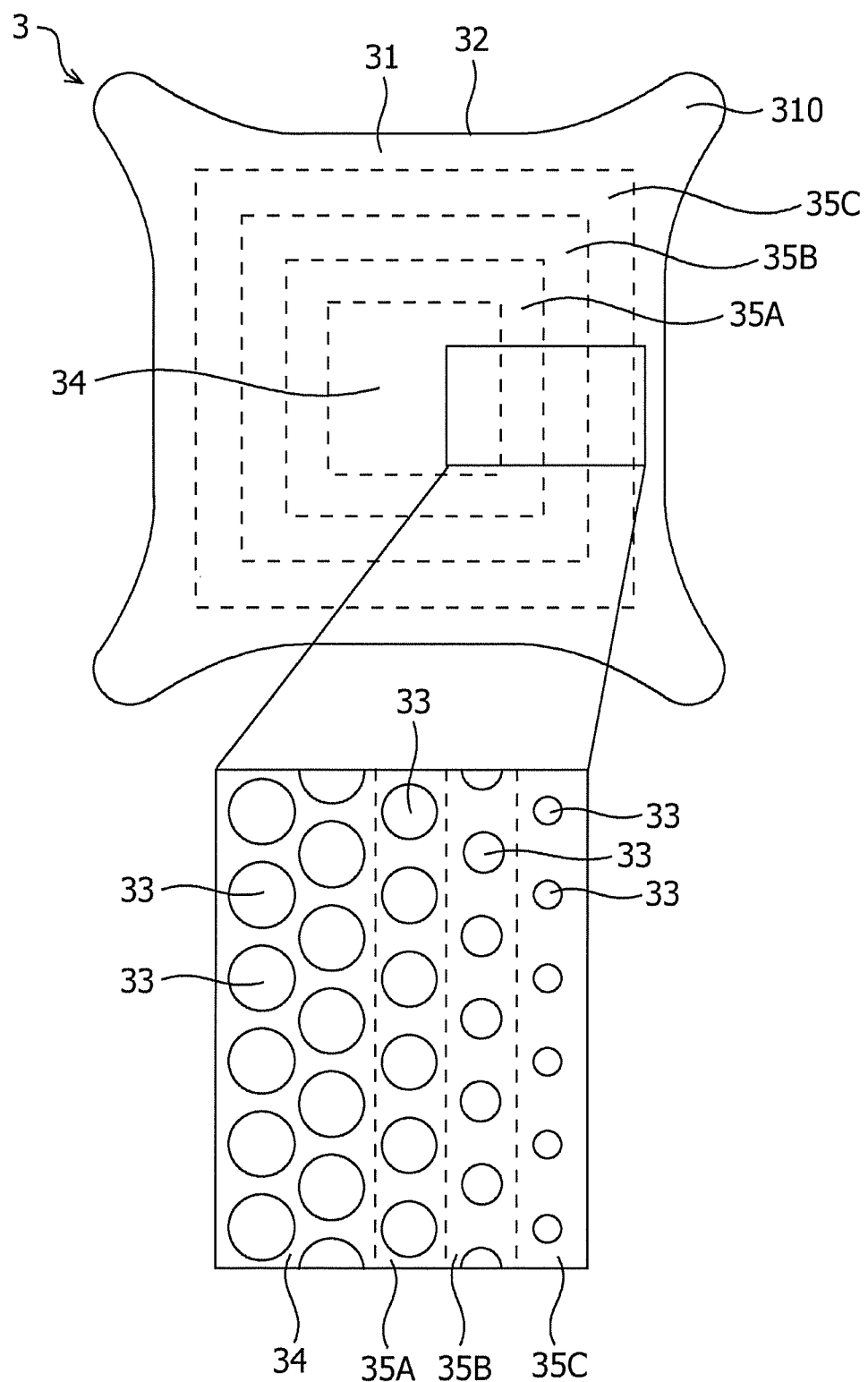
FIG. 5E is a plan view of a backplate.

In the example of the backplate 3 shown in FIG. 5A, a plurality of through-holes 33 are in two rows in the peripheral regions 35A to 35C. Without being limited to the example of the backplate 3 shown in FIG. 5A, the plurality of through-holes 33 may be in three or more rows in the peripheral regions 35A to 35C. Further, as shown in FIG. 5E, the plurality of through-holes 33 may be in a single row in the peripheral regions 35A to 35C.

Figure 6A:
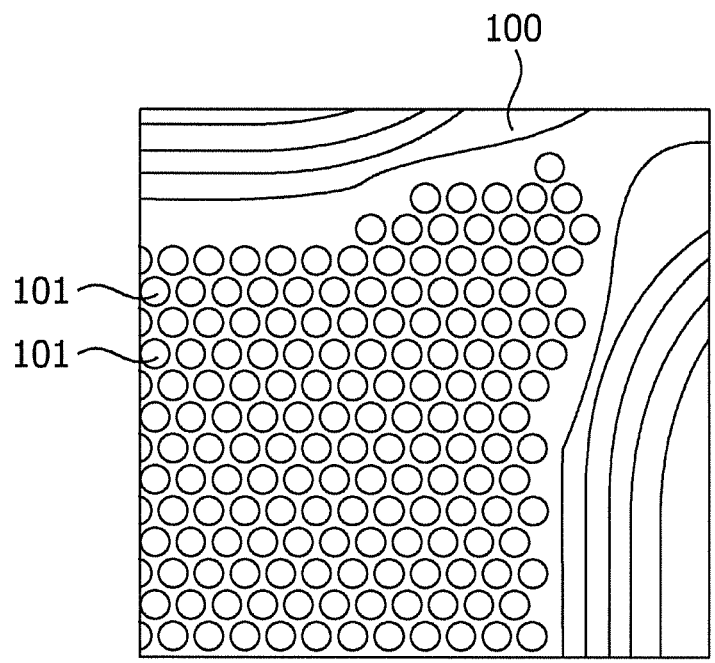
FIG. 6A is a plan view of a reference backplate.
Figure 6B:
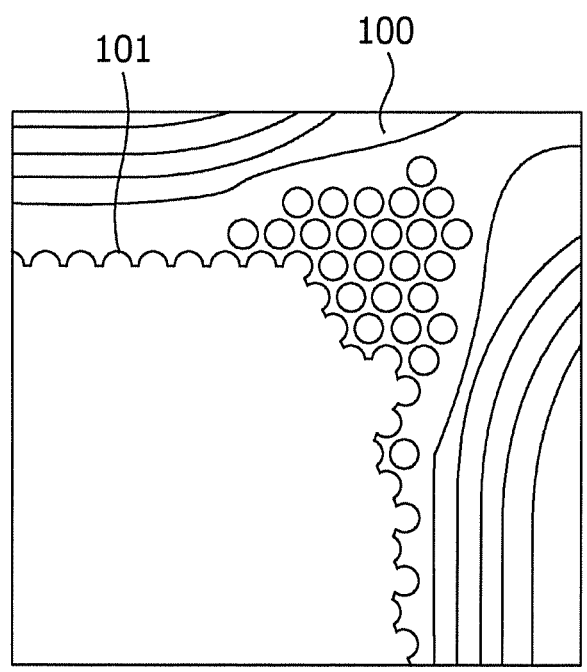
FIG. 6B is a plan view of a reference backplate.

FIGS. 6A and 6B are plan views of a backplate 100 according to a reference example. FIG. 6A shows the backplate 100 before a pressure test and FIG. 6B shows the backplate 100 after the pressure test. During the pressure test the strength of the backplate 100 was measured by applying pressure to the backplate 100. As shown in FIG. 6A, a plurality of through-holes 101 with equally sized openings are placed at a constant interval from the center to the edge of the backplate 100; in this case, the stress tends to concentrate near the outermost through-holes 101, thereby reducing the strength of the backplate 100. As shown in FIG. 6B, the through-holes 101 near the edge of the backplate 100 can break when the backplate 100 is subjected to significant external pressure. The stress tends to further concentrate near the outermost through-holes 101 with more percentage open area in the backplate 100, thereby further reducing the mechanical strength of the backplate 100. The percentage open area of the backplate 100 represents a ratio of a total area occupied by the through-holes 101 to the total area of the upper surface of the backplate 100.

Figure 7A:
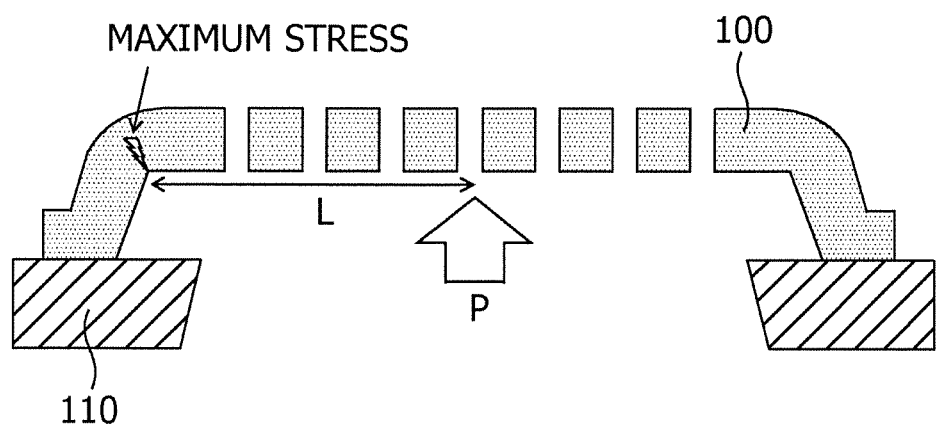
FIG. 7A is a schematic view of a reference backplate.
Figure 7B:
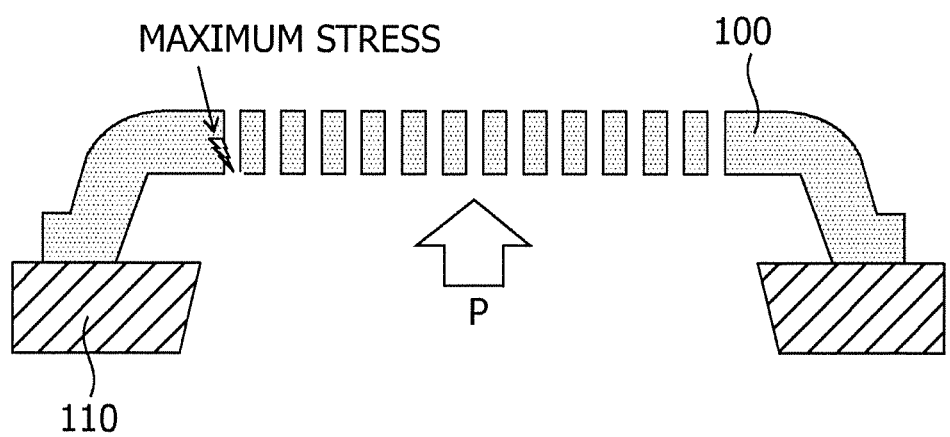
FIG. 7B is a schematic view of a reference backplate.

The break in the backplate 100 is described with reference to FIG. 7A and FIG. 7B. FIG. 7A and FIG. 7B are schematic views of the backplate 100 according to a reference example; the backplate 100 is on a silicon substrate 110. As shown in FIG. 7A, when the backplate 100 includes a small open area, the peripheral portion of the backplate 100 may break when the backplate 100 is subjected to significant external pressure. A bending stress σ can be calculated using M/Z, where M represents the bending moment and Z represents the section modulus. A bending moment M (=L×P) reaches its maximum at the peripheral portion of the backplate 100 furthest away from the pressure point on the backplate 100, thereby generating a maximum stress at the peripheral portion of the backplate 100. As shown in FIG. 7B, when the backplate 100 includes a large open area, the portion near the outermost through-holes 101 may break when the backplate 100 is subjected to significant external pressure. With a large percentage open area in the backplate 100, reducing the width of the portions surrounding the through-holes 101 reduces the section modulus Z; thus, the maximum stress is generated at the portions surrounding the outermost through-holes 101.

Figure 8A:
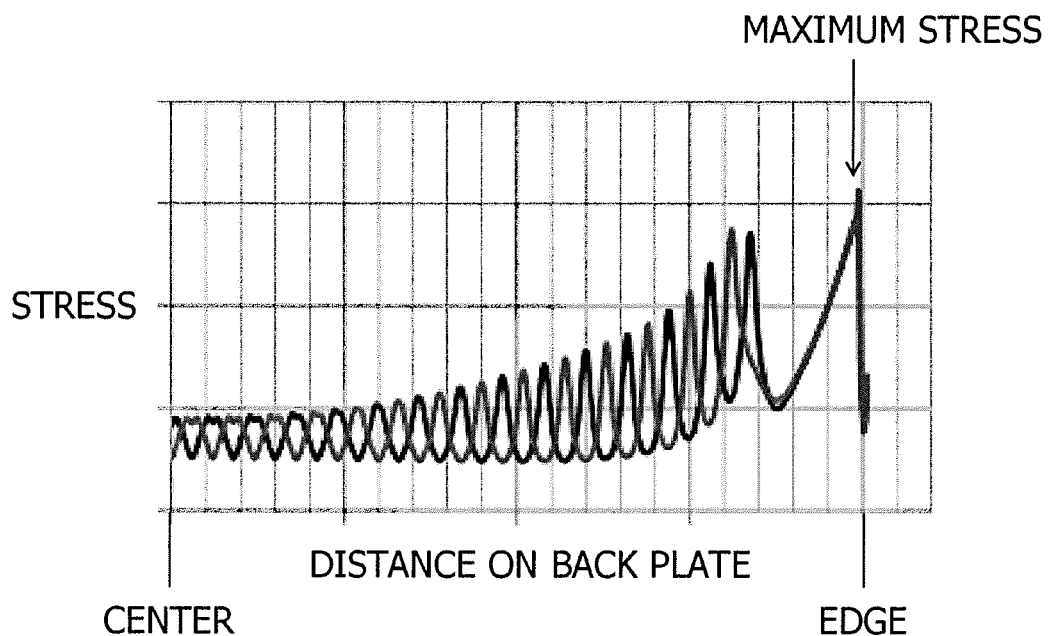
FIG. 8A depicts the result of a stress simulation for a reference backplate.
Figure 8B:
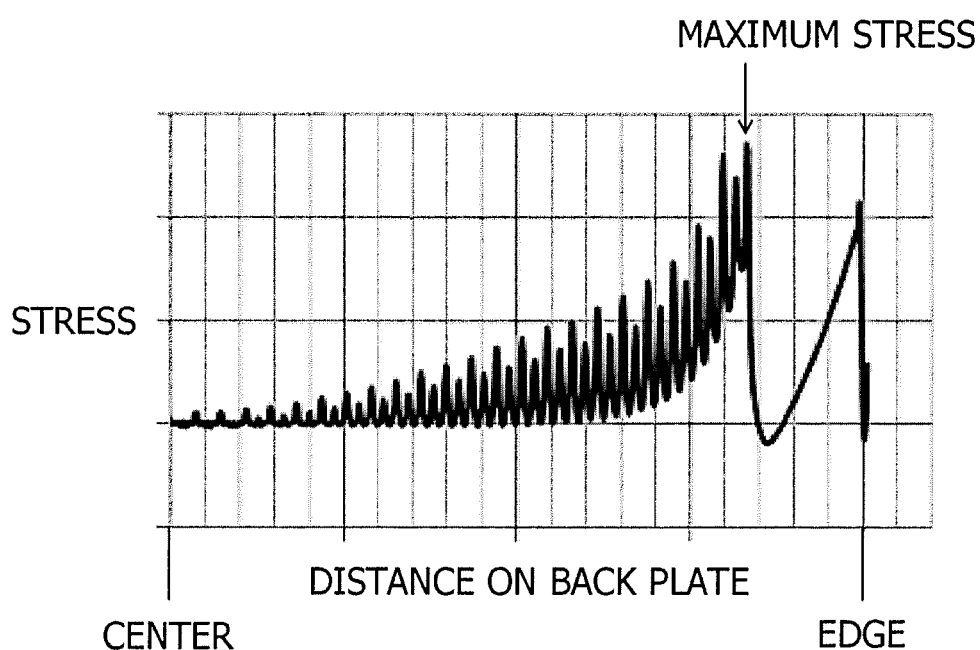
FIG. 8B depicts the result of a stress simulation for a reference backplate.

FIG. 8A and FIG. 8B depict the results of stress simulations on the backplate 100 according to a reference example. FIG. 8A shows the result of a stress simulation when the percentage open area in the backplate 100 is 45%. FIG. 8B shows the result of a stress simulation when the percentage open area in the backplate 100 is 60%. During the stress simulation an upward pressure was applied to the center of the backplate 100 and the stress generated in the backplate 100 was calculated. The vertical and horizontal axes in FIG. 8A and FIG. 8B represent the stress generated in the backplate 100 and the distance from the center of the backplate 100 respectively. As shown in FIG. 8A, given an percentage open area in the backplate 100 of 45%, the stress increases from the center to the edge of the backplate 100 when a significant external pressure is applied thereto, and the maximum stress is generated at the edge of the backplate 100. As shown in FIG. 8B, given an percentage open area in the backplate 100 of 60%, the stress increases from the center to the edge of the backplate 100 when a significant external pressure is applied thereto, and the maximum stress is generated at a portion near the outermost through-holes 101.

The airflow resistance between the backplate 3 and the diaphragm 4 (squeeze-film damping resistance) can be minimized by increasing the percentage open area in the center region 34 and in the peripheral regions 35A through 35C. Thereby, a signal-to-noise ratio (SNR) of the capacitive transducer 1 increases. The openings of all the through-holes 33 may be a given larger size; in this case, the portion around the through-holes near the edge of the backplate body 31 breaks when the backplate 3 is subject to a significant external pressure. Therefore, the through-holes 33 in the backplate 3 are configured such that the percentage open areas in the center region 34 and in the peripheral regions 35A to 35C gradually decrease from the center region 34 toward the edge of the backplate body 31 in the capacitive transducer 1 according to an embodiment. The through-holes 33 thusly configured make it possible to increase the percentage open areas in the center region 34 and in the peripheral regions 35A through 35C while maintaining the mechanical strength of the backplate 3, thereby increasing the signal-to-noise ratio of the capacitive transducer 1.

Figure 9:
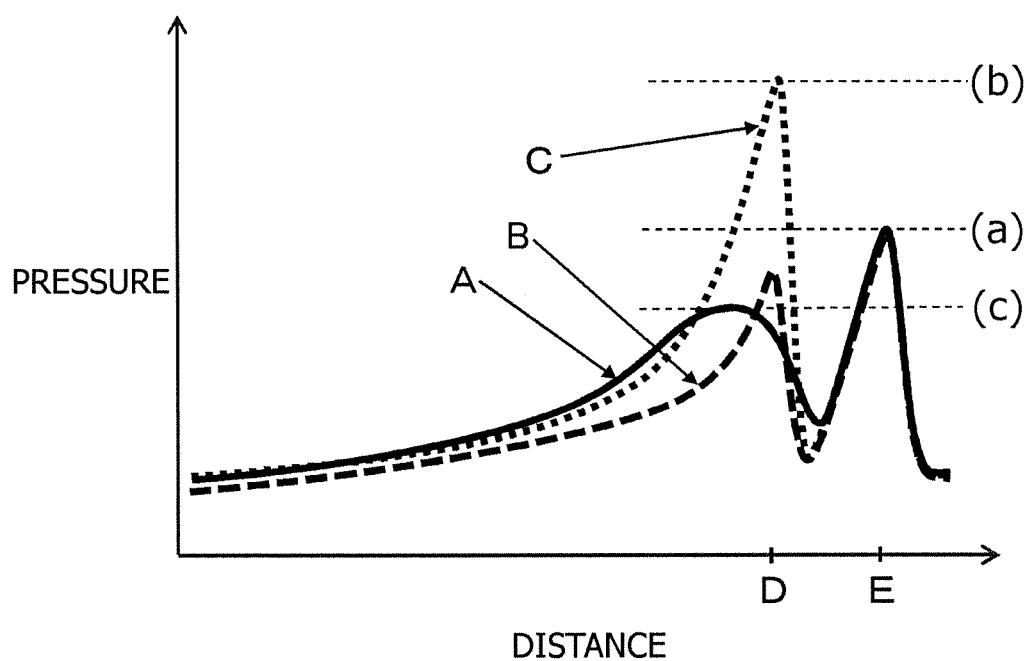
FIG. 9 depicts the results of stress simulations for a backplate according to an embodiment and a reference backplate.

FIG. 9 depicts the results of stress simulations on the backplate 3 according to an embodiment and the backplate 100 according to a reference example. The solid line A in FIG. 9 shows the result of the stress simulation on the backplate 3. The dotted line B in FIG. 9 shows the result of the stress simulation on the backplate 100 with a small percentage open area in the backplate 100. The dotted line C in FIG. 9 shows the result of the stress simulation on the backplate 100 with a large percentage open area in the backplate 100. The vertical axis in FIG. 9 represents the stress generated in the backplate 3 or the stress generated in the backplate 100. The horizontal axis in FIG. 9 represents the distance from the center portion of the backplate 3 or the distance from the center portion of the backplate 100. The percentage open area in the backplate 3 represented by the solid line A in FIG. 9 is equivalent to the percentage open area in the backplate 100 represented by the dotted line C in FIG. 9. The percentage open area in the backplate 3 represents a ratio of the total area occupied by the through-holes 33 to the total area of the bottom surface 38 or the upper surface 39 of the backplate 3.

As depicted by the solid line A in FIG. 9, the stress peaks at a distance E. The distance E on the backplate 3 corresponds to the distance from the center of the backplate 3 to the edge thereof. That is, the stress peaks at the edge of the backplate 3 ((a) in FIG. 9). As depicted by the dotted line B in FIG. 9, the stress peaks at a distance E. The distance E in the backplate 100 corresponds to the distance from the center of the backplate 100 to the edge thereof. That is, when the backplate 100 has a small open area, the stress peaks at the edge of the backplate 100 ((a) in FIG. 9). As depicted by the dotted line C in FIG. 9, the stress peaks at a distance D. The distance D on the backplate 100 corresponds to the distance from the center of the backplate 100 to the outermost through-holes 101. That is, when the backplate 100 has a large open area, the stress peaks at the outermost through-holes 101 in the backplate 100 ((b) in FIG. 9). FIG. 9 also shows that it is possible to reduce the stress at the outermost through-holes 33 in the backplate 3 ((c) in FIG. 9), and that the stress peaks at the edge of the backplate 3 ((a) in FIG. 9). As can be further understood from FIG. 9, the peak stress on the backplate 3 can be reduced while keeping a large percentage open area in the backplate 3, thereby increasing the breaking strength of the backplate 3.

As shown FIG. 10A, the peripheral regions 35A to 35C may partially (discretely) surround the center region 34. The peripheral region 35A is the closest to the center region 34 and partially surrounds the center region 34. The peripheral region 35B partially surrounds the center region 34 and the peripheral region 35A. The peripheral region 35C is the closest to the edge of the backplate body 31 and partially surrounds the center region 34 and the peripheral regions 35A, 35B. Accordingly, the peripheral regions 35A to 35C are arranged in order from the center region 34 toward the edge of the backplate body 31. In the example of the backplate 3 shown in FIG. 10A, the four corners of the center region 34 extend toward the four corners of the backplate body 31. Stress tends to concentrate at the sides of the backplate body 31 and tends not to concentrate at the four corners of the backplate body 31. Therefore, extending the four corners of the center region 34 toward the four corners of the backplate body 31 can reduce the peak stress of the backplate 3 while maintaining a large percentage open area in the backplate 3, thereby maintaining the mechanical strength of the backplate 3.

The arrangement of the center region 34 and the peripheral regions 35A to 35C in the backplate 3 in FIG. 5A may be combined with the arrangement of the center region 34 and the peripheral regions 35A to 35C in the backplate 3 in FIG. 10A. For example, the peripheral region 35A may partially surround the center region 34; the peripheral region 35B may partially surround the center region 34 and the peripheral region 35A; and the peripheral region 35C may completely surround the center region 34 and the peripheral regions 35A, 35B.

Figure 10B:
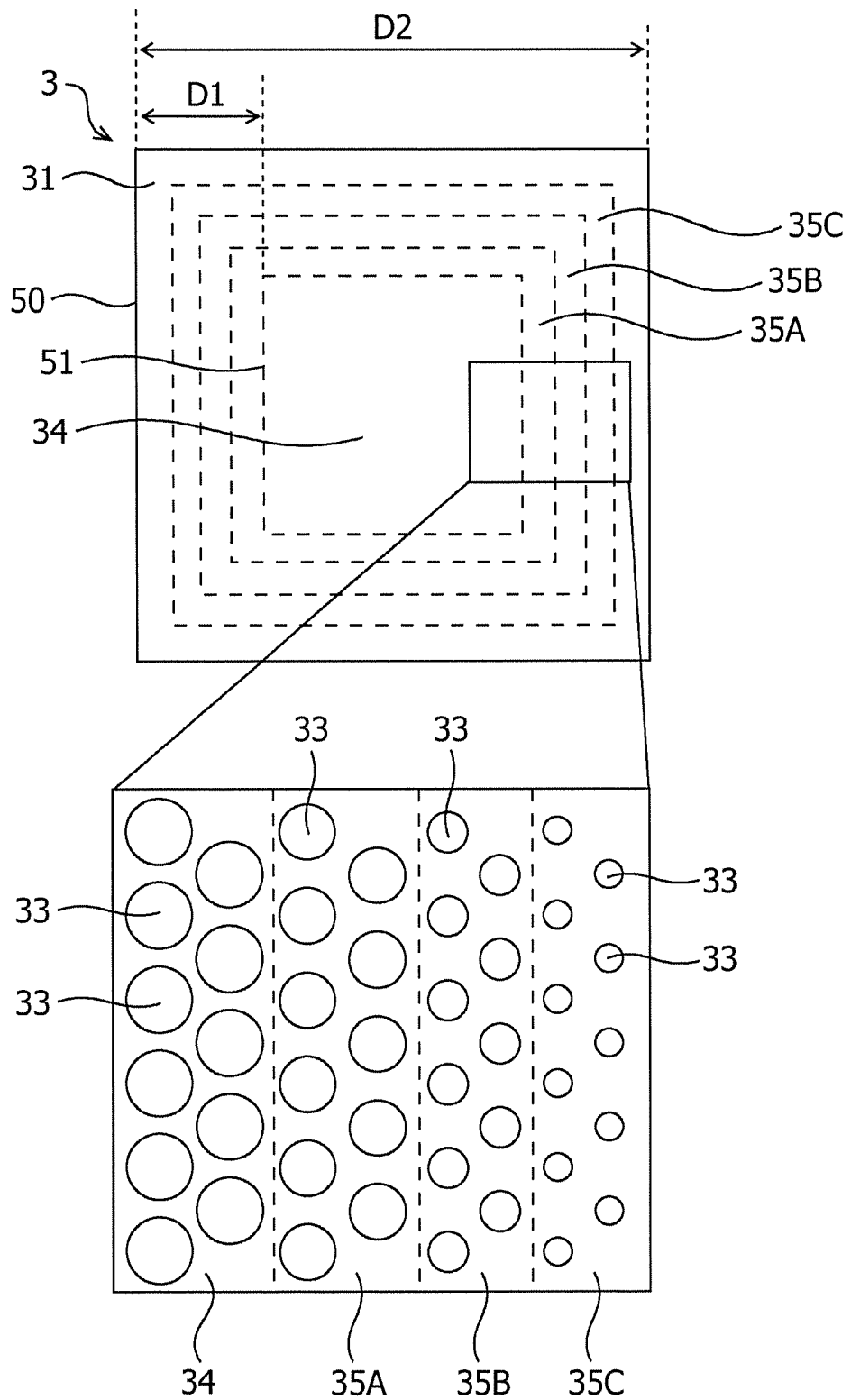
FIG. 10B is a plan view of a backplate.

FIG. 10B is a plan view of the backplate 3. As shown in FIG. 108, the backplate body 31 may square-like when viewed in a direction normal to the bottom surface 38 of the backplate 3 (in plan view). The four corners of the backplate body 31 do not appear to protrude in plan view in the example of the backplate 3 shown in FIG. 10B. The bottom surface 38 of the backplate 3 faces the diaphragm 4. The backplate support 32 is not shown in FIG. 10B. In the example of the backplate 3 shown in FIG. 10B, the distance D1 from the edge 50 of the backplate body 31 to the edge 51 of the center region 34 is 25% or less of the distance D2 between two opposing sides of the backplate body 31. In the example of the backplate 3 shown in FIG. 10B, the backplate body 31 is square-like and includes two opposing sides, however the backplate body 31 may be a polygon including two opposing sides. The distance D1 from the edge 50 of the backplate body 31 to the edge 51 of the center region 34 is preferably 20% or less of the distance D2 between two opposing sides of the backplate body 31. The distance D1 from the edge 50 of the backplate body 31 to the edge 51 of the center region 34 is more preferably 15% or less of the distance D2 between two opposing sides of the backplate body 31. Given the distance D1 from the edge 50 of the backplate body 31 to the edge 51 of the center region 34 is 25% or less of the distance D2 between two opposing sides of the backplate body 31, it is possible to reduce the peak stress of the backplate 3 while maintaining a large percentage open area in the backplate 3, thereby maintaining the mechanical strength of the backplate 3. The backplate 3 achieves the same performance as the example of the backplate 3 shown in FIG. 10B even when the backplate body 31 includes the protrusions 310. For example, the backplate body 31 except for the protrusions 310 may appear square-like in plan view, and the distance D1 from the edge 50 of the backplate body 31 to the edge 51 of the center region 34 may be 25% or less, 20% or less, or 15% or less of the distance D2 between two opposing sides of the backplate body 31.

Figure 10C:
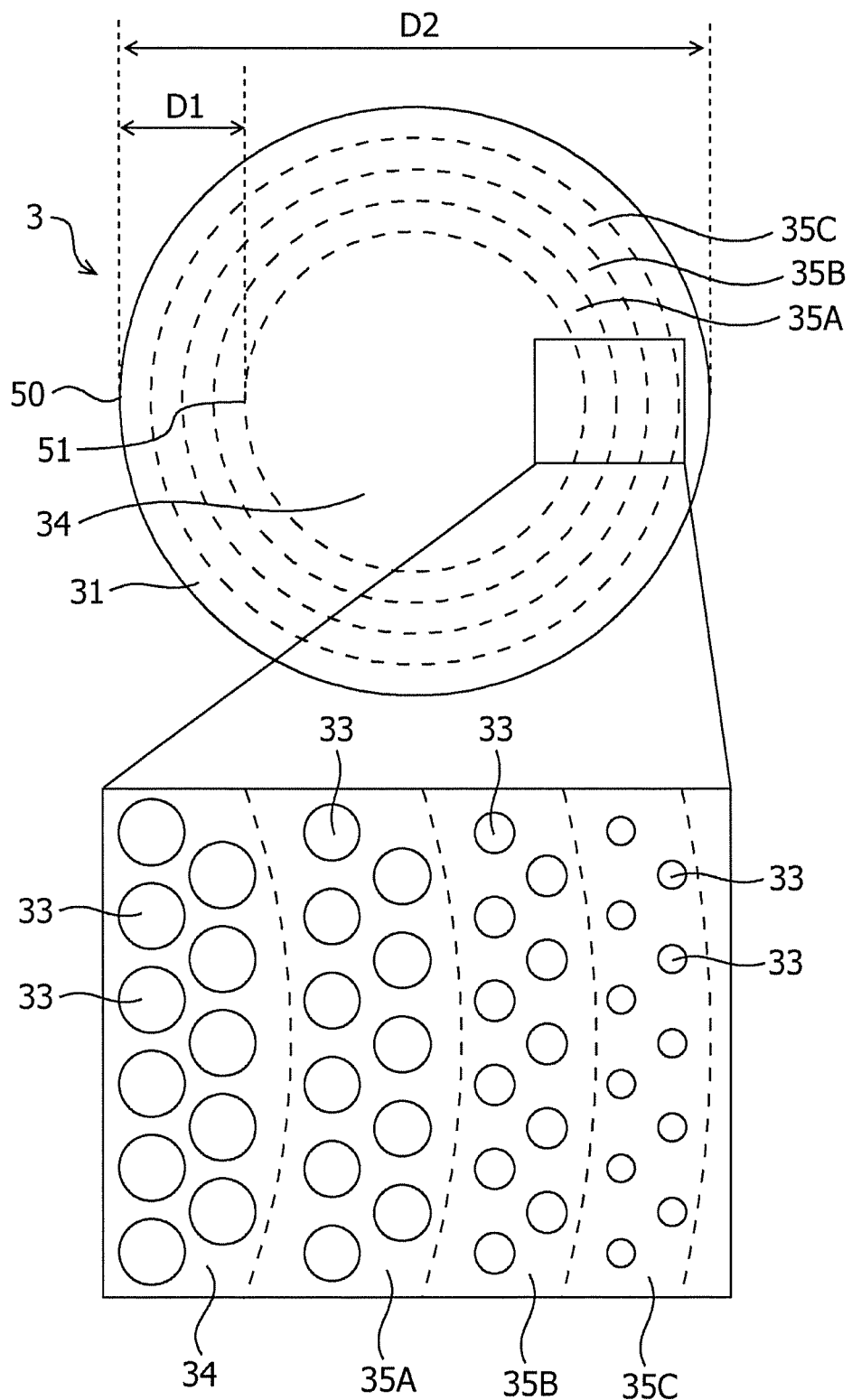
FIG. 10C is a plan view of a backplate.

FIG. 10C is a plan view of the backplate 3. As shown in FIG. 10C, the backplate body 31 may appear circular in plan view. In the example of the backplate 3 shown in FIG. 100, the four corners of the backplate body 31 do not protrude in plan view. The backplate support 32 is not shown in FIG. 100. The center region 34 and the peripheral regions 35A to 35C may be concentrically arranged with mutually different diameters. In the example of the backplate 3 shown in FIG. 100, the distance D1 from the edge 50 of the backplate body 31 to the edge 51 of the center region 34 is 25% or less of the diameter D2 of the circle. The distance D1 from the edge 50 of the backplate body 31 to the edge 51 of the center region 34 is preferably 20% or less of the diameter D2 of the circle. The distance D1 from the edge 50 of the backplate body 31 to the edge 51 of the center region 34 is more preferably 15% or less of the diameter D2 of the circle. Given the distance D1 from the edge 50 of the backplate body 31 to the edge 51 of the center region 34 is 25% or less of the diameter D2 of the circle, it is possible to lower the peak stress of the backplate 3 while maintaining a large percentage open area in the backplate 3, thereby maintaining the mechanical strength of the backplate 3. The backplate 3 achieves the same performance as the example of the backplate 3 shown in FIG. 100 even when the backplate body 31 includes the protrusions 310. For example, the backplate body 31 except for the protrusions 310 may appear circular shape in plan view, and the distance D1 from the edge 50 of the backplate body 31 to the edge 51 of the center region 34 may be 25% or less, 20% or less, or 15% or less of the diameter D2 of the circular shape.

The percentage open area in the center region 34 may be 50% or more. The center region 34 tends to have a significant effect on the noise of a transducer 1. It is possible to improve the signal-to-noise ratio of the transducer 1 by establishing the percentage open area in the center region 34 at 50% or greater.

Figure 11A:
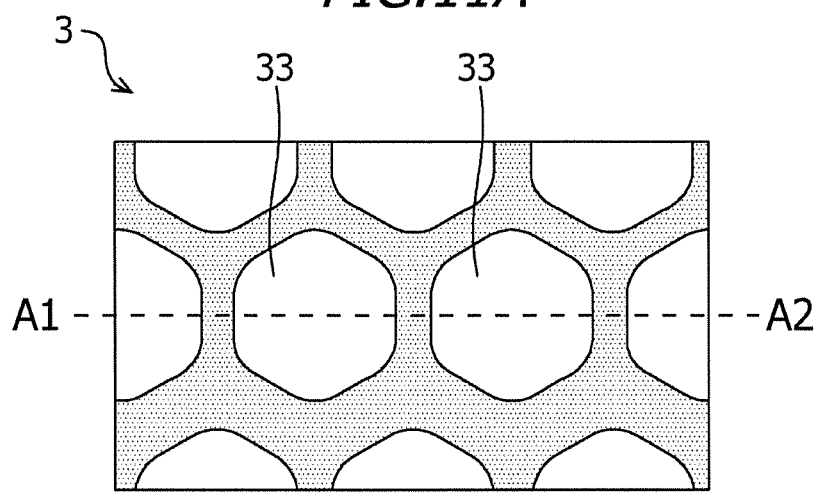
FIG. 11A is a plan view of a backplate.
Figure 11B:
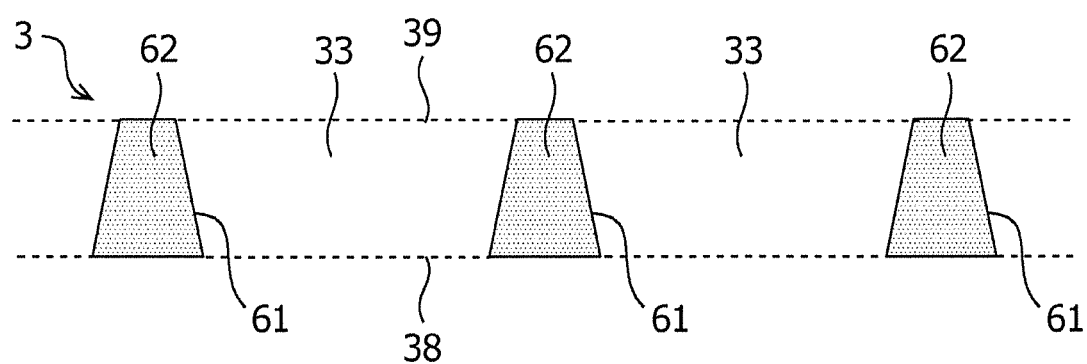
FIG. 11B is a cross-sectional view of a backplate.
Figure 11C:
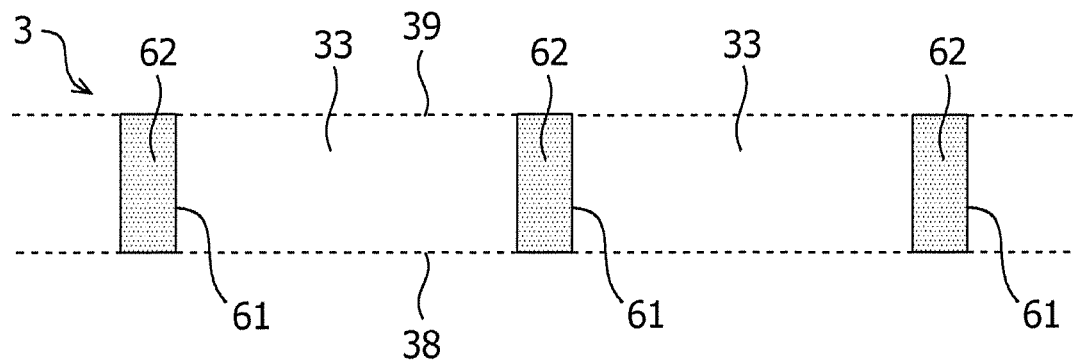
FIG. 11C is a cross-sectional view of a backplate.

FIG. 11A is a plan view of the backplate 3 showing a portion of the backplate 3. FIG. 11B and FIG. 11C are cross-sectional views of the backplate 3 showing cross-sections along a dotted line A1-A2 shown in FIG. 11A. The through-holes 33 have tapered inner surfaces where the diameter of the through-holes 33 widens from the bottom surface 38 toward the upper surface 39 of the backplate 3. The bottom surface 38 of the backplate 3 faces the diaphragm 4 of the backplate 3 with the upper surface 39 of the backplate 3 opposite thereto. In the example of the backplate 3 shown in FIG. 11B, the angle of the inner surface 61 of the through-holes 33 relative to the bottom surface 38 of the backplate 3 is 70°. In another example of the backplate 3 shown in FIG. 11C, the angle of the inner surface 61 of the through-holes 33 relative to the bottom surface 38 of the backplate 3 is 90°. The angle of the inner surface 61 of the through-holes 33 relative to the bottom surface 38 of the backplate 3 may be between 70° and 90°, inclusive.

It is possible to increase the section modulus of the bars 62 in the backplate 3 by setting the angle between the inner surface 61 of the through-holes 33 and the bottom surface 38 of the backplate 3 to between 70° and 90°, inclusive, thereby increasing the strength of the bars 62 in the backplate 3 against a bending stress. The bars 62 in the backplate 3 are the portions between adjacent through-holes 33 in the backplate 3. The through-holes 33 may be densely packed in the backplate 3 by setting the angle of the inner surface 61 of the through-holes 33 to between 70° and 90°, inclusive, and thus facilitate increasing in the percentage open area of the backplate 3. When the through-holes 33 are densely packed in the backplate, the upper portion of the bars 62 in the backplate 3 may recede if the angle between the inner surface 61 of the through-holes 33 and the bottom surface 38 of the backplate 3 is less than 70°. An angle between the inner surface 61 of the through-holes 33 and the bottom surface 38 of the backplate 3 of 70° and 90°, inclusive, addresses the risk of losing the upper portion of the bars 62 in the backplate 3, even when the through-holes 33 are densely packed in the backplate 3. As a result, the backplate 3 can be reliably manufactured.

Figure 12:
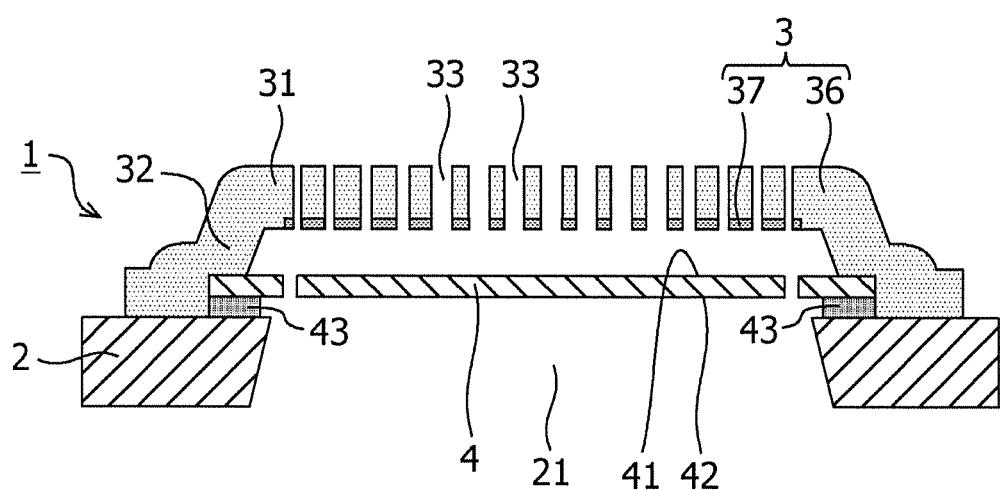
FIG. 12 is a schematic view of a capacitive transducer.

FIG. 12 is a schematic view of the capacitive transducer 1. A part of the backplate support 32 has a bent portion that comes in contact with the upper surface 41 of the diaphragm 4 with the diaphragm 4 on the inside of the bent portion of the backplate support 32. For example, the backplate support 32 has the bent portion including a part parallel to the diaphragm 4 that allows the bent portion to come in contact with the upper surface 41 of the diaphragm 4. Alternatively, the backplate support 32 may have a protruding portion that comes in contact with the upper surface 41 of the diaphragm 4. The diaphragm 4 is secured to the silicon substrate 2 via a fixing part 43 with the diaphragm 4 sandwiched between the silicon substrate 2 and the backplate support 32. The backplate 3 is supported by both the silicon substrate 2 the diaphragm 4 since a part of the backplate support 32 is held in contact with the upper surface 41 of the diaphragm 4. The above structure increases the mechanical strength of the backplate 3.

The surrounding portions of the through-holes 33 are stronger when the openings of the through-holes 33 are circular or elliptical compared to when the openings are polygonal shapes. The mechanical strength of the backplate 3 increases around the through-holes 33 in the center region 34 and the peripheral regions 35A to 35C when the openings of the through-holes 33 included in the center region 34 and the peripheral regions 35A to 35C have any of one shape selected from a group consisting of a circle and an ellipse. As shown in FIG. 9, since the stress peaks at the edge of the backplate 3, it is preferable to increase the mechanical strength of the portions around the through-holes 33 near the edge of the backplate 3. For example, when the openings of the through-holes 33 in the peripheral region 35C have any one shape selected from a group consisting of a circle and an ellipse, the mechanical strength increases for the portions around the through-holes 33 included in the peripheral region 35C.

When the openings of the through-holes 33 included in the peripheral regions 35A to 35C are ellipses, the major axis of the elliptical through-holes 33 may be oriented toward the center region 34. When a plurality of through-holes 33 included in the peripheral regions 35A to 35C are ellipses and the major axes of the ellipses are oriented toward the center region 34, the distance between two adjacent through-holes 33 increases along the minor axes of the elliptical through-holes 33. As a result, the section modulus of the bars 62 of the backplate 3 around the plurality of through-holes 33 included in the peripheral regions 35A to 35C increases thereby increasing the strength of the bars 62 in the backplate 3 against a bending stress. Note that the minor axis of an elliptical shape is perpendicular to the major axis of the elliptical shape.

The openings of the through-holes 33 included in the center region 34 may be hexagonal (substantially hexagonal), thereby increasing the percentage open area of the center region 34. It is possible to increase the percentage open area in each of the peripheral regions 35A to 35C by establishing hexagonal (or substantially hexagonal) openings for the through-holes 33 in each of the peripheral regions 35A to 35O regardless of whether the peripheral regions 35A to 35C are linear or curved.

What is claimed is:

1. A transducer comprising:
a substrate having a hole;
a backplate facing an opening of the hole in the substrate; and
a diaphragm facing the backplate with an air gap therebetween,
wherein the backplate includes a backplate body, a backplate support secured to the substrate and supporting the backplate body, and a plurality of through-holes perforating the backplate body,
wherein the backplate body includes a center region having a portion of the plurality of through-holes, and three or more peripheral regions partially or completely surrounding the center region and each having another portion of the plurality of through-holes,
wherein each of the three or more peripheral regions partially or completely surrounds the center region,
wherein the plurality of through-holes defines a percentage open area in each of the center region and the three or more peripheral regions, and the percentage open areas are mutually different,
wherein the percentage open areas in the center region and in the three or more peripheral regions are constant throughout each region,
wherein the percentage open area in the center region is larger than the percentage open area in each of the three or more peripheral regions, and
wherein the percentage open area in an outermost peripheral region of the backplate body is smaller than the percentage open area in the peripheral region near the center region.

2. The transducer according to claim 1,
wherein the backplate body appears polygonal with two opposing sides when viewed along a direction normal to a surface of the backplate facing the diaphragm, and
wherein a distance from an edge of the backplate body to an edge of the center region is 25% or less of a distance between the two opposing sides.

3. The transducer according to claim 2, wherein the center region has the percentage open area that is 50% or greater.

4. The transducer according to claim 2,
wherein inner surfaces of the through-holes taper with a diameter of the through-hole widening from a surface of the backplate facing the diaphragm toward a surface opposite thereto, and
wherein an angle between the inner surface of the through-hole and the surface of the backplate facing the diaphragm is between 70° and 90°, inclusive.

5. The transducer according to claim 1,
wherein the backplate body appears circular shape when viewed along a direction normal to a surface of the backplate facing the diaphragm, and
wherein a distance from an edge of the backplate body to an edge of the center region is 25% or less of a diameter of the circular shape.

6. The transducer according to claim 5, wherein the center region has the percentage open area that is 50% or greater.

7. The transducer according to claim 5,
wherein inner surfaces of the through-holes taper with a diameter of the through-hole widening from a surface of the backplate facing the diaphragm toward a surface opposite thereto, and
wherein an angle between the inner surface of the through-hole and the surface of the backplate facing the diaphragm is between 70° and 90°, inclusive.

8. The transducer according to claim 1, wherein the center region has the percentage open area that is 50% or greater.

9. The transducer according to claim 8,
wherein the inner surfaces of the through-holes taper with the diameter of the through-hole widening from the surface of the backplate facing the diaphragm toward the surface opposite thereto, and
wherein the angle between the inner surface of the through-hole and the surface of the backplate facing the diaphragm is between 70° _and 90°, inclusive.

10. The transducer according to claim 1,
wherein inner surfaces of the through-holes taper with a diameter of the through-hole widening from a surface of the backplate facing the diaphragm toward a surface opposite thereto, and
wherein an angle between the inner surface of the through-hole and the surface of the backplate facing the diaphragm is between 70° and 90°, inclusive.

11. The transducer according to claim 1, wherein a part of the backplate support is held in contact with a surface of the diaphragm facing the backplate.

12. The transducer according to claim 1, wherein the backplate body and the backplate support are integrally formed.

13. The transducer according to claim 1, wherein the backplate body and the backplate support are separate materials.

14. The transducer according to claim 1, wherein openings of the through-holes have at least one shape selected from a group consisting of a circle, an ellipse, a polygon, and a rounded polygon.

15. The transducer according to claim 1, wherein openings of the through-holes in at least one of the three or more peripheral regions have at least one shape selected from a group consisting of a circle and an ellipse.

16. The transducer according to claim 1, wherein except for the peripheral region closest to an edge of the backplate body, openings of the through-holes in the center region and the peripheral regions have at least one shape selected from a group consisting of a hexagon and a rounded hexagon.

17. The transducer according to claim 1, wherein the through-holes in the center region are regularly arranged.

18. The transducer according to claim 1, wherein openings of the through-holes in at least one of the three or more peripheral regions are ellipses with a major axis thereof oriented toward the center region.

19. The transducer according to claim 1, wherein the hole in the substrate is a cavity in the substrate.

20. The transducer according to claim 1, wherein the peripheral regions are concentrically arranged around the center region.

* * * * *